United States Patent [19]
Morimoto

[11] Patent Number: 4,721,548
[45] Date of Patent: Jan. 26, 1988

[54] SEMICONDUCTOR PLANARIZATION PROCESS

[75] Inventor: Seiichi Morimoto, Aloha, Oreg.

[73] Assignee: Intel Corporation, Santa Clara, Calif.

[21] Appl. No.: 49,100

[22] Filed: May 13, 1987

[51] Int. Cl.[4] .................... B44C 1/22; C03C 15/00; C03C 25/06

[52] U.S. Cl. ..................... 156/657; 156/663; 252/79.3; 252/79.4; 427/376.2; 437/228; 437/235

[58] Field of Search ............... 156/653/657, 662, 663; 437/228, 235, 238; 427/240, 376.2, 248.1; 252/79.3, 79.4

[56] References Cited

U.S. PATENT DOCUMENTS

| | | | |
|---|---|---|---|
| 4,539,744 | 9/1985 | Burton | 156/657 X |
| 4,634,494 | 1/1987 | Taji et al. | 156/657 X |
| 4,676,867 | 6/1987 | Elkins et al. | 156/657 X |

Primary Examiner—William A. Powell
Attorney, Agent, or Firm—Blakely, Sokoloff, Taylor & Zafman

[57] ABSTRACT

Planarization process for planarizing glass layer which receives first layer metal. Spin-on-glass is cured in steam and then etched back using hydrofluoric and nitric acids diluted in acetic acids.

10 Claims, 4 Drawing Figures

SEMICONDUCTOR PLANARIZATION PROCESS

BACKGROUND OF THE INVENTION

1. Field of the Invention

The invention relates to the planarization of glass layers used in semiconductors.

2. Prior Art

Glass layers are frequently used in the fabrication of semiconductor integrated circuits. For example, these insulative layers are used in metal-oxide-semiconductor (MS) circuits over polysilicon members to insulate them from overlying metal lines, and between layers of metal lines.

When a glass layer is deposited over underlying members an undulating contour frequently results. When a metal layer is formed on this surface, several problems occur which are a direct result of the non-planarized surface. For instance, stress cracks can occur in the metal at abrupt corners and voids beneath the metal.

An early solution to this problem consisted of reflowing the glass layer after its formation. See U.S. Pat. No. 3,825,442. It is not always possible to reflow the glass layer. This reflow does not provide a sufficiently planar surface for overlying metal layers in many processes.

Another solution to this problem is to planarize (e.g., flatten) this glass surface through etching. In one technique a spin-on-glass is formed on the surface. The spin-on-glass, because of the spinning during formation, provides a planar surface. Then a plasma etching step is used which etches away both the spin-on-glass and deposited glass until a planar surface of the deposited glass is reached. This technique is described in "A Planarization Process for Double Metal CMOS Using Spin-on-Glass as a Sacrificial Layer" by Elkins, Reinhart and Tang, *IEEE* V-MIC Conference, June 9-10, 1986. For other uses of spin-on-glass, see U.S. Pat. No. 4,587,138. Also see application Ser. No. 870,234, Filed June 3, 1986, entitled ETCH-BACK PLANARIZATION FOR DOUBLE MEAL VLSI, and assigned to the assignee of the present invention.

The present invention is an improvement on the process described in the above-referenced article.

SUMMARY OF THE INVENTION

A planarization process for use in the fabrication of semiconductor integrated circuits is disclosed. A glass layer is covered with a spin-on-glass layer. The glass layer is then cured in an atmosphere of steam in the temperature range of 600 to 650 degrees C. Then the layers are wet etched using an etchant of hydrofluoric acid and nitric acid diluted with acetic acid.

DETAILED DESCRIPTION OF THE INVENTION

A process for planarizing a glass layer such as used during the fabrication of a metal-oxide-semiconductor integrated circuit is described. In the following description, numerous specific details are set forth such as layer thicknesses in order to provide a thorough understanding of the present invention. It will be obvious, however, to one skilled in the art that the present invention may be practiced without these specific details. In other instances, well-known processing steps have not been described in order not to unnecessarily obscure the present invention in detail.

Figure 1:
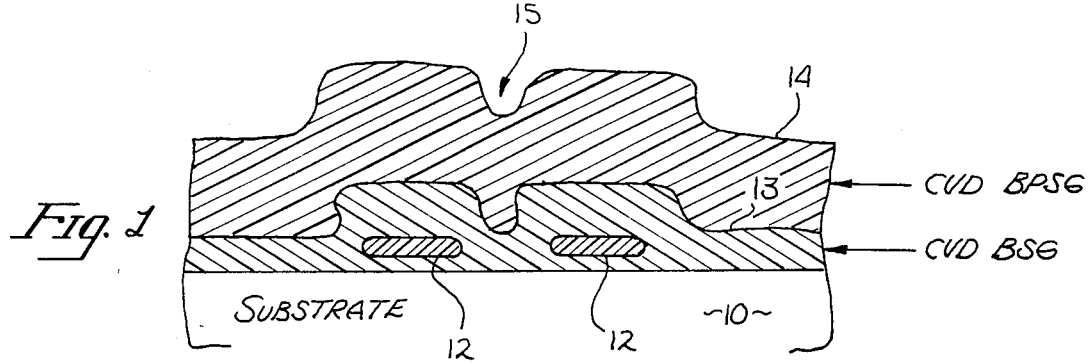
FIG. 1 is a cross-sectional elevation view of a substrate which includes polysilicon circuit members covered by two layers of glass.

Referring to FIG. 1, a substrate 10 is shown along with two polycrystalline silicon (polysilicon) or refractory metal circuit members 12. This cross-section is intended to show a typical MS circuit commonly used in p-channel, n-channel or CMOS processing. The invented planarization process can be used over any underlying layers which can withstand the temperatures used in the planarization process. The circuit members 12 are covered with a glass layer 13. In the currently preferred embodiment, layer 13 is a chemical vapor deposited (CVD) boron silicate glass. By way of example, this glass layer may be 4000 A thick. In the currently preferred embodiment, a dual glass structure is used, and accordingly, a second glass layer 14 is deposited over layer 13. The second layer comprises a CVD boron and phosphorus silicate glass approximately 1.5 microns thick. This dual glass layer is not, however, necessary for the present invention.

As shown in FIG. 1, the upper surface of layer 14 includes numerous abrupt contours such as shown at 15. Generally, these contours result from the glass layers covering edges of underlying circuit elements such as the polysilicon members 12. If a metal layer is formed on layer 14, the abrupt contours, as mentioned above, can cause problems. When double metal layers are used it is even more important that the upper surface of layer 14 be relatively planar.

Figure 2:
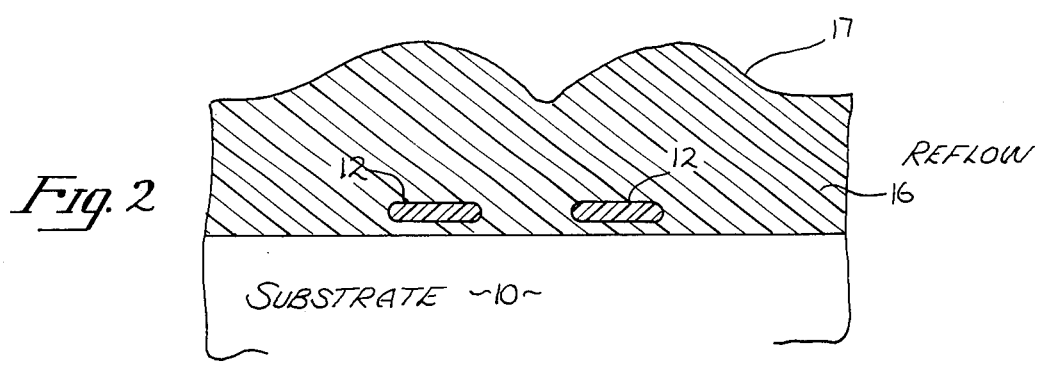
FIG. 2 illustrates the substrate of FIG. 1 after a glass reflow step.

In the currently preferred embodiment, the structure of FIG. 1 is subject to a reflow step as is commonly used in the semiconductor industry. The substrate is placed in a furnace and the temperature raised to cause the glass layers to reflow. The temperature at which reflow occurs is a function of the particular glass used. For purposes of illustration, the layers 13 and 14 of FIG. 1 is are shown as a single layer 16 in FIG. 2 after the reflow. Note the upper surface 17 of layer 16 has more gentle contours than layer 14. In practice, even after reflow, the contours of the glass layer are abrupt enough to cause problems with overlying metal layers or planarization of overlying layers such as the insulative layer used between overlying metal layers.

With the present invention, a spin-on-glass layer 19 is formed over the surface 17. Any one of numerous commercially available spin-on-glasses may be used such as one of the inorganic spin-on-glasses. Layer 19 is on the average 3000 Å thick in the currently preferred embodiment. Since the spin-on-glass is in fact spun-on its upper surface is flat.

Now the spin-on-glass is cured in an atmosphere of steam at a temperature of between approximately 600 degrees C. to 650 degrees C. This curing reduces the etching rate of the spin-on glass in subsequent processing.

Figure 3:
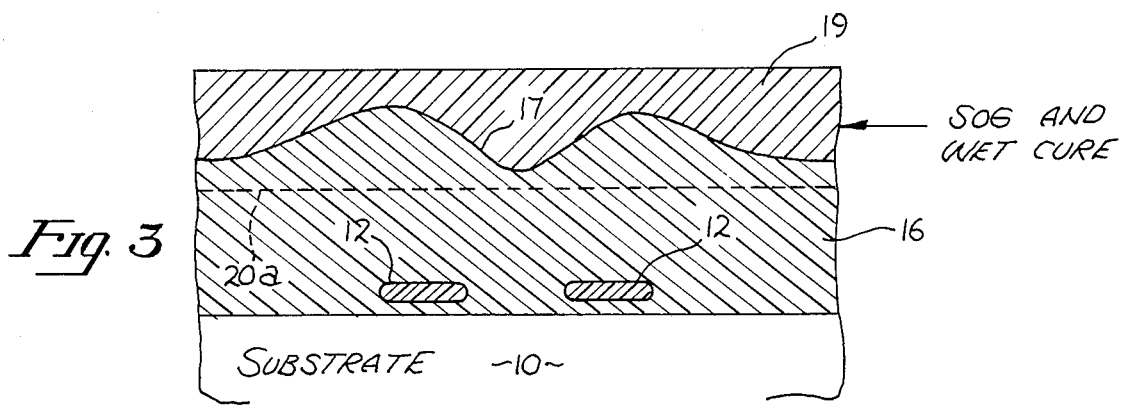
FIG. 3 illustrates the substrate of FIG. 2 after a spin-on-glass has been formed and cured.
Figure 4:
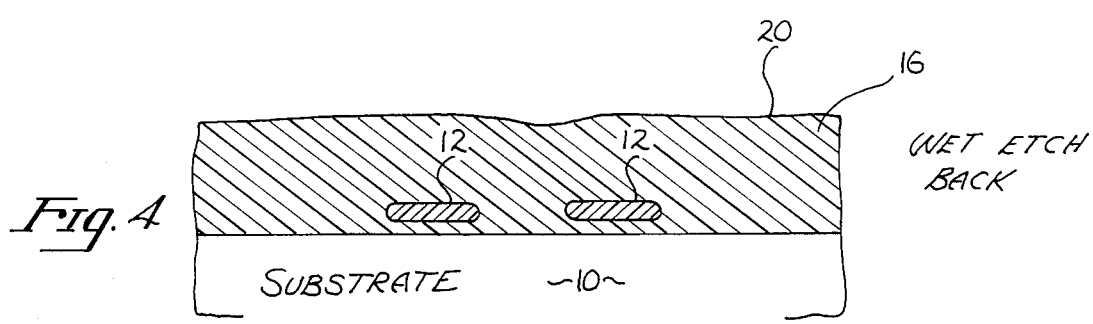
FIG. 4 illustrates the substrate of FIG. 3 after a wet etching step.

Now the substrate is dipped in a wet etchant which preferably etches both the spin-on-glass and underlying glass layer 16 at the same rate. This preserves the planar nature of the structure of FIG. 3 and results in the relatively flat surface 20 shown in FIG. 4. That is, the structure of FIG. 3 is etched down to line 20a shown in FIG. 3. By way of example, approximately 1 micron of layer 16 is etched away leaving a thickness of approximately 1 micron on the substrate. With the etchant described below, this requires an approximate 3 minute dip with the etchant at room temperature.

To obtain a 1-to-1 etchant selectivity between layers 16 and 19, a mixture of hydrofluoric acid, nitric acid, diluted in acetic acid is used. By way of example, one part by volume of hydrofluoric acid is mixed with 10 parts of nitric acid in 25 parts of acetic acid. The acetic acid does not assist in the selectivity, but rather is used to dilute the solution and to prevent etching of the wafer back.

Thus, a planarization process has been described which is particularly useful for planarizing a glass surface disposed above polysilicon members which receives a first metal layer.

What is claimed is:

1. In the fabrication of a semiconductor integrated circuit, a process for planarizing a glass layer comprising the steps of:
   covering said glass layer with a spin-on-glass layer;
   curing said spin-on-glass layer in an atmosphere of steam;
   wet etching said layers; whereby a planarized glass layer is formed.

2. The process defined by claim 1 wherein said curing occurs at a temperature of approximately 600 degrees C. to 650 degrees C.

3. The process defined by claim 2 wherein said wet etching comprises the use of hydrofluoric and nitric acids.

4. The process defined by claim 3 wherein said acids are diluted.

5. The process defined by claim 4 wherein said acids are diluted with acetic acid.

6. The process defined by claims 1 or 3 wherein said glass layer is heated to a sufficient temperature to cause glass reflow prior to covering said glass layer with said spin-on-glass layer.

7. In the fabrication of a semiconductor integrated circuit, a process for planarizing a glass layer which is formed over underlying polysilicon members comprising the steps of:
   covering said glass layer with a spin-on-glass layer;
   curing said spin-on-glass layer in an atmosphere of steam at a temperature or approximately 600 degrees C. to 650 degrees C.;
   wet etching said layers with an etchant which etches both said layers at approximately the same rate;
   whereby a planarized glass layer is formed.

8. The process defined by claim 7 wherein said wet etchant comprises hydrofluoric and nitric acids.

9. The process defined by claim 8 wherein said acids are diluted in acetic acid.

10. The process defined by claims 7 or 9 wherein prior to covering said glass layer with said spin-on-glass layer, said glass layer is subjected to an elevated temperature so as to cause glass reflow.

* * * * *